United States Patent [19]

Ishii

[11] 4,035,727

[45] July 12, 1977

[54] MULTICHANNEL RADIO TRANSMITTER WITH MEANS TO PREVENT ABNORMAL WAVE RADIATION

[75] Inventor: Masaharu Ishii, Tokyo, Japan

[73] Assignee: Shinto Denki Co., Ltd., Tokyo, Japan

[21] Appl. No.: 643,476

[22] Filed: Dec. 22, 1975

[30] Foreign Application Priority Data

Apr. 9, 1975  Japan ............................ 50-43027

[51] Int. Cl.² ........................................ H04B 1/04
[52] U.S. Cl. ................. 325/184; 325/17; 325/25; 325/174; 325/176
[58] Field of Search ................. 325/17, 18, 20–22, 325/25, 63, 148, 168, 171, 174, 176, 177, 184

[56] References Cited

U.S. PATENT DOCUMENTS

| | | | |
|---|---|---|---|
| 2,845,536 | 7/1958 | Goldstein | 325/176 |
| 2,958,768 | 11/1960 | Brauer | 325/18 |
| 3,146,398 | 8/1964 | Schnadelbach | 325/184 |
| 3,413,554 | 11/1968 | Yates et al. | 325/184 |
| 3,641,434 | 2/1972 | Yates et al. | 325/184 |
| 3,882,424 | 5/1975 | DeBois et al. | 325/148 |

*Primary Examiner*—Robert L. Griffin
*Assistant Examiner*—Jin F. Ng
*Attorney, Agent, or Firm*—Woodwock, Washburn, Kurtz & Mackiewicz

[57] ABSTRACT

A multichannel transmitter incorporating a phase-locked loop frequency synthesizer to generate a carrier signal of a selected radio frequency, which carrier is subsequently amplified, modulated, and radiated into space. In order to prevent abnormal radiation which would take place as when the PLL frequency synthesizer is switched from one transmission channel to another, a transmission stopper circuit is connected to the output of the phase comparator or detector of the synthesizer so as to be actuated thereby when the desired phase or frequency lock is not established in the synthesizer. When actuated, the transmission stopper circuit prevents the wave radiation of the transmitter, as by causing nonconduction through a transistor provided therein. The invention is disclosed as adapted for a transceiver.

2 Claims, 8 Drawing Figures

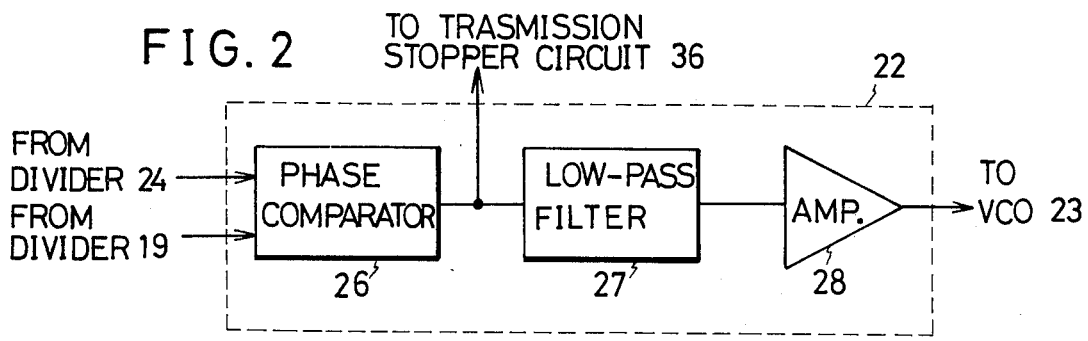
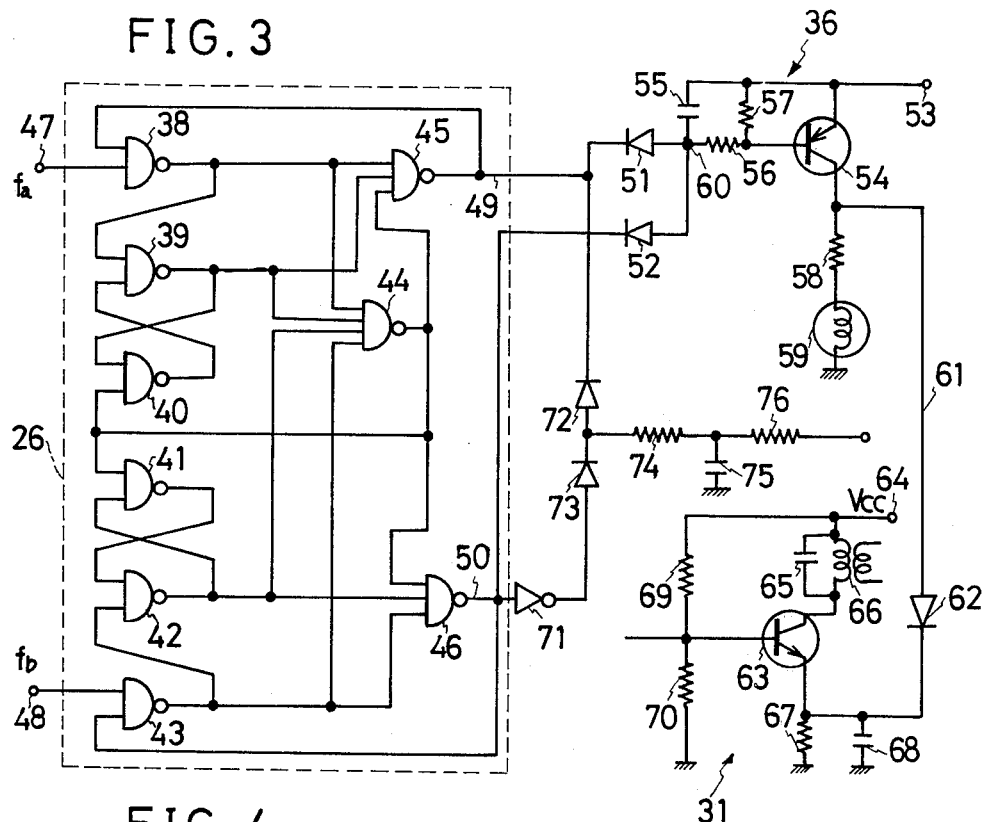
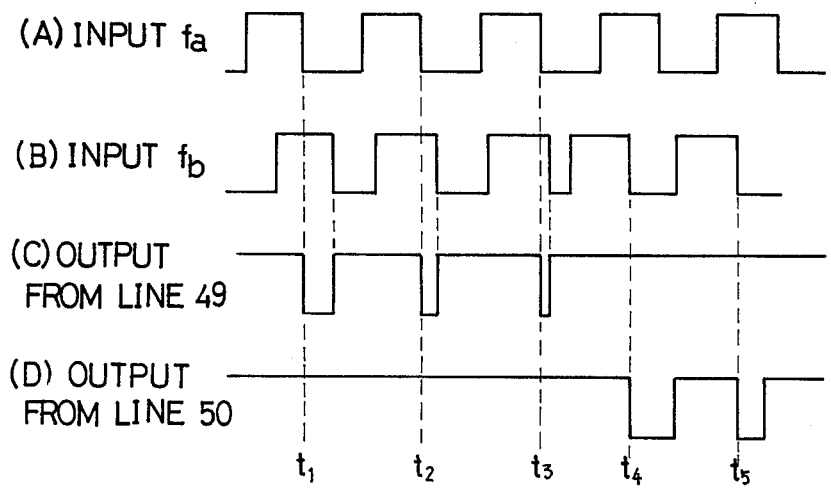

MULTICHANNEL RADIO TRANSMITTER WITH MEANS TO PREVENT ABNORMAL WAVE RADIATION

BACKGROUND OF THE INVENTION

This invention relates generally to radio transmitters, and more specifically to a multichannel radio transmitter incorporating a phase-locked loop (PLL) frequency synthesizer for production of various transmitting frequencies. The transmitter according to the invention is particularly well adaptable for a multichannel transceiver.

The PLL frequency synthesizer has recently found its way into multichannel transceivers. combined with a single reference frequency oscillator, the synthesizer provides a choice of a number of different frequencies required for multichannel transmission and multichannel superheterodyne reception. Advantageously, the PLL frequency synthesizer drastically reduces the number of quartz crystal units in crystal oscillators used in the transceiver and is further capable of providing a carrier of highly stabilized frequency.

The mulichannel transmitter with the PLL frequency synthesizer has a serious drawback, however. The synthesizer inevitably generates some spurious frequency signal for some brief time immediately after switching from one transmission channel to another, or in the event of the malfunctioning of some of its components. Such spurious signal generation by the sysnthesizer results in wave radiation into space at other than the prescribed frequencies and, possibly, in the damage of the output stage of the transmitter.

SUMMARY OF THE INVENTION

It is an object of this invention to provide an improved multichannel radio transmitter incorporating PLL frequency synthesizer, such that the operation of the transmitter is automatically suspended while the synthesizer is generating some spurious frequency signal.

With this and other objects in view this invention provides, in a multichannel radio transmitter of the type defined, the improvement comprising sensing means connected to the output of the phase comparator or detector in the PLL frequency synthesizer so as to be actuated when the desired phase or frequency lock is not established in the synthesizer, and inhibiting means responsive to the actuation of the sensing means to prevent the wave radiation of the transmitter.

According to more specific aspects of the invention, the sensing means comprises a pair of diodes, and the inhibiting means comprises a transistor. The transistor is switched by the diodes to prevent the wave radiation of the transmitter as by causing nonconduction through a transistor in the frequency converter, amplifier or other component of the transmitter. In preferred embodiments of the invention hereinafter disclosed, the sensing and inhibiting means are both incorporated into what is herein termed a transmission stopper circuit. The output of the transmission stopper circuit is coupled to a frequency converter of the transmitter for control thereof.

The novel features which are considered characteristic of this invention are set forth in particular in the appended claims. The invention itself, however, both as to its organization and method of operation, together with the further objects and advantages thereof, will become apparent in the course of the following description read in connection with the accompanying drawings in which like reference characters refer to like parts throughout the several views.

BRIEF DESCRIPTION OF THE DRAWINGS

FIG. 2 is a block diagram of the phase comparator circuit in the transceiver of FIG. 1;

FIG. 3 is a schematic electrical diagram showing in more detail the phase comparator and transmission stopper circuit in the transceiver of FIG. 1;

FIGS. 4(A) to 4(D) are waveform diagrams of the input and output signals of the phase comparator in the transceiver of FIG. 1;

DESCRIPTION OF THE PREFERRED EMBODIMENTS

Figure 1:
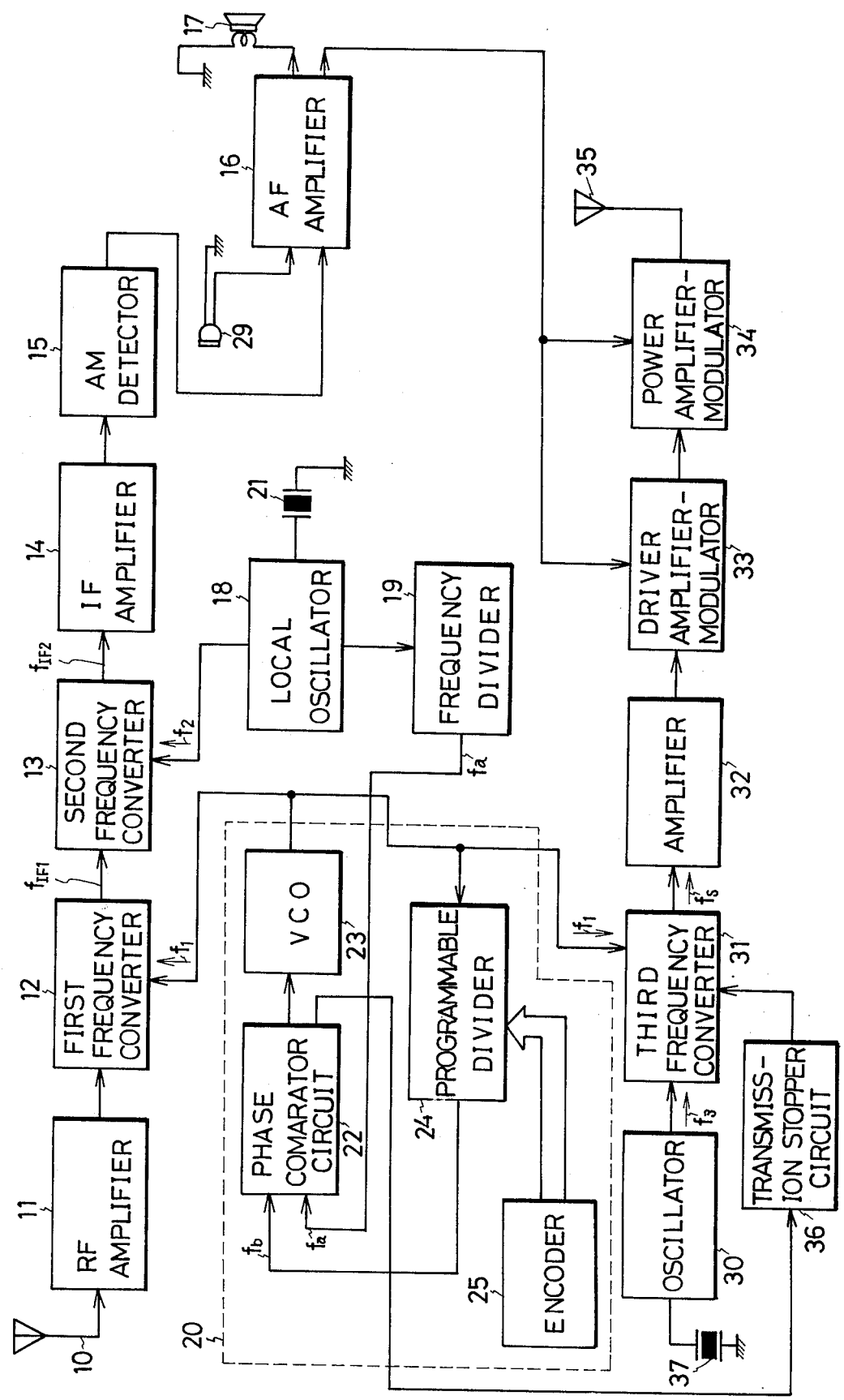
FIG. 1 is a block diagram of a multichannel transceiver incorporating a preferred form of the radio transmitter according to the invention.

In FIG. 1 of the accompanying drawings the radio transmitter according to the invention is shown combined with a double superheterodyne multichannel receiver to provide a transceiver. The receiver section of the illustrated transceiver comprises a receiving antenna circuit 10, radio-frequency (RF) amplifier 11, first frequency converter or mixer 12, second frequency converter or mixer 13, intermediate-frequency (IF) amplifier 14, amplitude-modulation (AM) detector 15, audio-frequency (AF) amplifier 16, loudspeaker 17, local osciallator 18, frequency divider 19, and PLL frequency synthesizer 20.

The incoming amplitude-modulated RF signal in a frequency band of, for example, 16.965 to 27.255 MHz is amplified by the RF amplifier 11 and delivered to the first frequency converter 12, where the amplified RF signal is combined with a signal $f1$ from the PLL frequency synthesizer 20 to provide a first IF signal $fIF1$ of, for example, 10.695 MHz. This first IF signal is subsequently combined, in the second frequency converter 13, with a signal $f2$ from the local oscillator 18.

The local osciallator 18 has a single quartz crystal 21 and produces the output signal $f2$ with a constant frequency of, for example, 10.24 MHz as determined by the natural frequency of vibration of the quarz crystal 21. The local oscillator signal $f2$ is supplied to both second frequency converter 13 and frequency divider 19.

In the second frequency converter 13 the local oscillator signal $f2$ is combined as aforesaid with the first IF signal $fIF1$ to provide a second IF signal $fIF2$ of, for example, 455 kHz. The second IF signal is then amplified by the IF amplifier 14, demodulated to the original intelligence by the AM detector 15, and translated into audible sound by the output means comprising the AF amplifier 16 and loudspeaker 17.

As is well known, the frequency of the output from a frequency divider is an integral submultiple of the input frequency. In this particular adaptation of the invention the frequency divider 19 is adapted to divide the 10.24 MHz local osciallator output frequency to ½$^{10}$, so that the frequency divider produces an output signal $fa$ with a reference frequency of 10 kHz. This reference frequency signal $fa$ from the frequency divider is delivered to the PLL frequency synthesizer 20.

The PLL frequency synthesizer 20 comprises a phase comparator or detector circuit 22 with a built-in low-pass filter and amplifier, voltage-controlled oscillator (VCO) 23, programmable frequency divider 24 (hereinafter referred to as the programmable divider), and encoder 25 having a channel selector switch (described later in detail with reference to FIG. 5).

More specifically, the frequency divider 19 has its output connected to the phase comparator circuit 22, to which there is also connected the output of the programmable divider 24. The output of the phase comparator circuit 22 is connected to the VCO 23. The output from the VCO 23 is, on the one hand, delivered to the first frequency converter 12 as the frequency synthesizer signal $f1$ and, on the other hand, fed back to the phase comparator circuit 22 via the programmable divider 24.

As shown in FIG. 2, the phase comparator circuit 22 comprises phase comparator or detector 26, low-pass filter 27, and amplifier 28 in serial connection. The phase comparator 26 is supplied with both the reference frequency signal $fa$ from the local oscillator 18 via the frequency divider 19 and the signal $fb$ from the VCO 23 via the programmable divider 24. The phase comparator 26 produces a DC output voltage related to the phase or frequency difference between the signals $fa$ and $fb$, and this DC output voltage is delivered to the VCO 23 via the low-pass filter 27 and amplifier 28 to control its output frequency in accordance with the prior art.

In practice the phase comparator circuit 22 may take the form of the IC chip MC 4044 manufactured Motorola Semiconductor Products Inc., of the United States. Also the VCO 23 may be the IC chip MC 4024, of Motorola, and the programmable divider 24 may be a cascade connection of the IC chips MC 74416, of Motorola.

With reference again to FIG. 1 the transmitter section of the transceiver comprises a microphone 29, oscillator 30, third frequency converter or midxer 31, amplifier 32, driver amplifier-modulator 33, power amplifier-modulator 34, transmitting antenna circuit 35, and transmission stopper circuit 36, in addition to the AF amplifier 16 and PLL frequency synthesizer 20 that are shared by both receiver and transmitter sections of the transceiver. The local oscillator 18 and frequency divider 19 may also be regarded as constituent parts of the transmitter in this paticular adaptation of the invention.

The oscillator 30 of the transmitter section is also the usual crystal oscillator having a single quartz crystal 37. This crystal oscillator is adapted to supply to the third frequency converter 31 the output $f3$ with a constant frequency of, for example, 10,695 MHz as determined by the natural frequency of vibration of the quartz crystal 37.

Also supplied to the third frequency converter 31 is the PLL frequency synthesizer signal $f1$ from the VCO 23, which signal is combined with the oscillator signal $f3$ to provide a carrier signal $fs$ having any selected one of, for example, 23 different transmitting frequencies in the band of 26.965 to 27.255 MHz. The driver amplifier-modulator 33 and power amplifier-modulator 34 receives the speech or intelligence signal from the microphone 29 via the AF amplifier 16 and modulates the carrier amplitude with the intelligence signal in the well known manner. The amplitude-modulated carrier of the selected frequency is radiated into sapce through the antenna circuit 35 as electromagnetic waves.

The transmission stopper circuit 36 is connected between the phase comparator 26 in the PLL frequency synthesizer 20 and the third frequency converter 31. The transmission stopper circuit functions to suspend the operation of the third frequency converter 31, and hence to prevent the wave radiation of the transmitter, when the signal $fb$ supplied to the phase comparator 26 from the programmable divider 24 is not locked in phase or frequency to the reference frequency signal $fa$ from the frequency divider 19, as will more fully appear from the following description of FIG. 3.

FIG. 3 is an illustration of the detailed configurations of the phase comparator 26, transmission stopper circuit 36, and third frequency converter 31. The phase comparator 26 comprises none NAND circuits 38 to 46 connected as shown, and a pair of input terminals 47 and 48 connected to the NAND circuits 38 and 43 respectively. The reference frequency signal $fa$ from the frequency divider 19 is delivered to the input terminal 47, whereas to the other input terminal 48 there is delivered the signal $fb$ from the VCO 23 via the programmable divider 24.

Let it be assumed that the phase comparator 26 is now supplied with the inputs $fa$ and $fb$ having waveforms as represented at (A) and (B), respectively, in FIG. 4. At moments $t1$, $t2$ and $t3$ in time, the input $fb$ is lower than the input $fa$ in frequency and also lags same in phase, with the result that low level output is produced from the output line 49 of the phase comparator 26, as will be seen from FIG. 4(C). At moments $t4$ and $t5$ in time, the input $fb$ is higher than the input $fa$ in frequency and also leads same in phase, with the result that low level output is produced from the output line 50 of the phase comparator, as will be seen from FIG. 4(D).

The transmission stopper circuit 36 comprises a pair of diodes 51 and 52, positive supply terminal 53, PNP transistor 54, filtering capacitor 55, filtering resistor 56, biasing resistor 57, resistor 58, and pilot lamp 59. The diodes 51 and 52 are connected to the output lines 37 and 38, respectively, of the phase comparator 26 to sense the outputs therefrom. The diode 51 becomes conductive upon production of the low level output from the line 49, as at the aforesaid moments $t1$, $t2$ and $t3$, and is held nonconductive during production of high level output from the line 49. The other diode 52 becomes conductive upon production of the low level output from the line 50, as at the moments $t4$ and $t5$, and is held nonconductive during production of high level output therefrom. Thus, the potential at a circuit point 60, where the outputs of the diodes 51 and 52 are interconnected, decreases when either of the diodes is rendered conductive.

The transistor 54, whose function it is to inhibit the operation of the third frequency converter 31 when conductive, has its emitter connected to the positive supply terminal 53, its base to the circuit point 60 via the resistor 56, and its collector grounded via the resistor 58 and pilot lamp 59. The transistor 54 becomes conductive when the potential at the circuit point 60 decreases to a predetermined degree, thereby permitting the pilot lamp 59 to be lit up. Simultaneously, an inhibiting signal is sent out into the third frequency converter 31 via line 61 having a reverse-blocking diode 62.

The third frequency converter 31 includes a frequency-converting NPN transistor 63, which has its collector connected to a supply terminal 64 via capacitor 64 and transformer 66, and its emitter connected to the diode 62 besides being grounded via resistor 67 and capacitor 68. Shown at 69 and 70 are biasing resistors.

The transistor 63 of the third frequency converter 31 is rendered nonconductive by the inhibiting signal from the transmission stopper circuit 36, that is, by the positive biasing voltage impressed to its emitter upon conduction of the transistor 54. With the operation of the third frequency converter 31 thus interrupted, no carrier signal is supplied from the converter to the amplifier 32 of the transmitter section of the transceiver (see FIG. 1). Inverter 71, diodes 72 and 73, resistor 74, capacitor 75 and resistor 76 shown in FIG. 3 constitute part of the circuit means arranged between the phase comparator 26 and the VCO 23 of the PLL frequency synthesizer 20.

Figure 5:
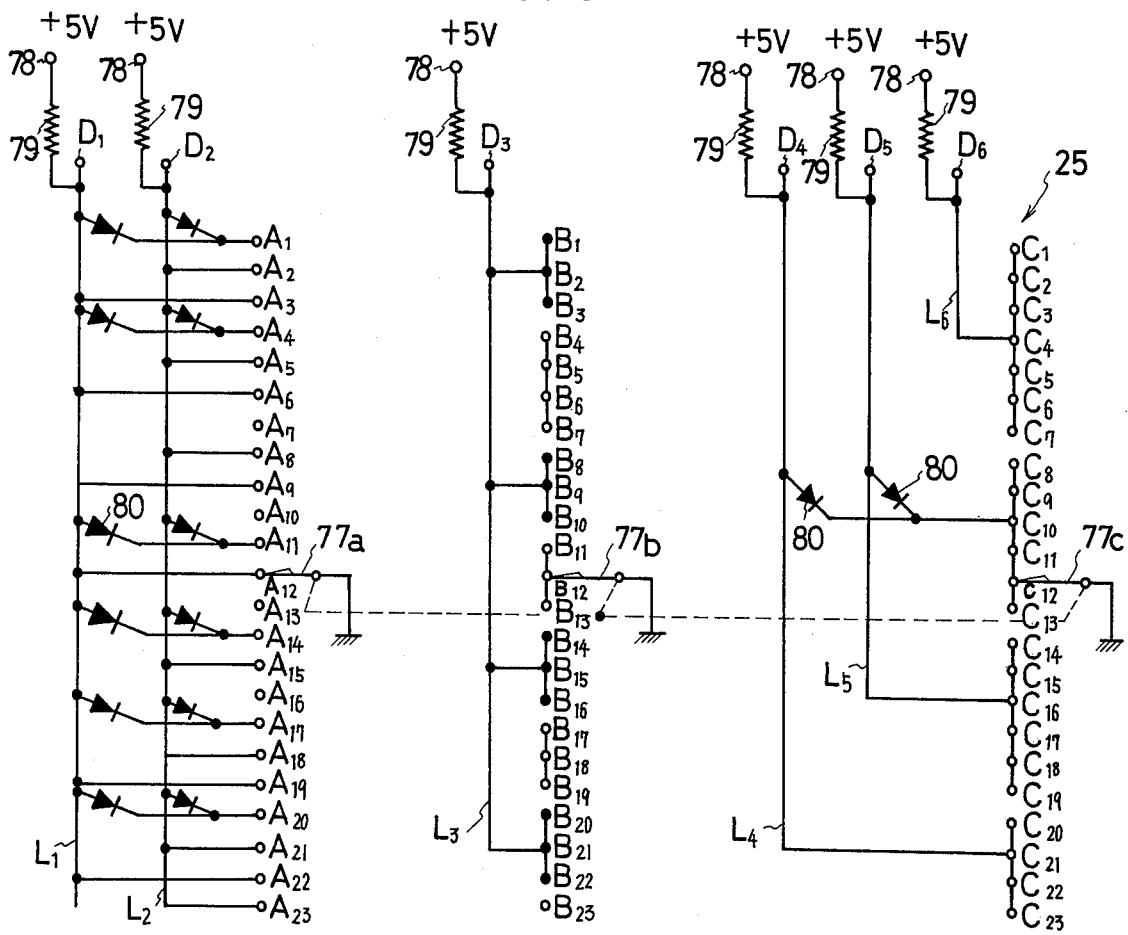
FIG. 5 is a schematic electrical diagram showing in detail the encoder in the transceiver of FIG. 1.

FIG. 5 illustrates the detailed configuration of the encoder 25 provided to the programmable divider 24 of the PLL frequency synthesizer 20. The encoder includes the channel selector switch having three ganged movable contacts 77a, 77b and 77c each grounded at one end. The movable contact 77a is selectively connectable to any of 23 fixed contacts A1 to 23; the movable contact 77b is selectively connectable to any of 23 fixed contacts B1 to B23; and the movable contact 77c is selectively connectable to any of 23 fixed contacts C1 to C23. It is to be understood, however, that the three ganged movable contacts 77a to 77c are always connected to the corresponding ones of the three groups of fixed contacts. In the showing of FIG. 5, for example, the three movable contacts are connected to the corresponding fixed contacts A12, B12 and C12 respectively.

The encoder 25 has lines L1 to L6 which are connected to the fixed contacts as shown and which are shown to be individually connected to 5-volt positive supply terminals 78 via respective resistors 79. Diodes 80 are connected respectively between the lines L1 and L2 and the fixed contacts A1, A4, A11, A14, A17 and A20 and between the lines L4 and L5 and the fixed contact C10. The lines L1 to L6 are also connected to output terminals D1 to D6 respectively. The output signals produced from these output terminals are delivered to the programmable divider 24 of the PLL frequency synthesizer 20 via a gate circuit (not shown).

Let it be assumed that, in the encoder network of FIG. 5, the three movable contacts 77a to 77c are now closed to the fixed contacts A1, B1 and C1 for selection of the first communication channel. Since then the fixed contacts A1, B1 and C1 become grounded via the respective movable contacts, the encoder output terminals D1 to D6 will produce, in combination, the binary digital output 000110. In this manner the encoder 25 provides 23 different binary digital outputs corresponding to the 23 communication channels. In accordance with these 23 different outputs from the encoder 25 the frequency dividing ratio of the programmable divider 36 is varied into 23 different ones.

The transceiver embodying this invention being constructed as described hereinabove with reference to FIGS. 1 to 5, the operation of its receiver section will first be described. The second frequency converter 13 is supplied with the local oscillator signal $f2$ with the constant frequency of 10.24 MHz. To the first frequency converter 12, on the other hand, the VCO 23 of the PLL frequency synthesizer 20 supplies the signal $f1$ with a frequency selected in accordance with the frequency of the incoming RF signal.

The frequency of the PLL frequency synthesizer signal $f1$ is selected from among the 23 different frequencies in the range of, for example, 16.270 to 16.560 MHz so that the first IF signal $fIF1$ produced by the first frequency converter 12 may have the constant frequency of 10.695 MHz. In other words, the PLL frequency synthesizer signal $f1$ is determined in accordance with the equation $f1 = fs - fIF1$, where $fs$ is the incoming RF signal frequency. If the incoming RF signal frequency is 26.965 MHz, for example, then the PLL frequency synthesizer signal frequency is selected to be 16.270 MHz.

The selection of the desired PLL frequency synthesizer signal frequency from among the 23 different frequencies is accomplished by the switching of the three ganged movable contacts 77a to 77c of the channel selector switch with respect to the respective groups of fixed contacts A, B and C in the encoder 25 of FIG. 5. For example, the PLL frequency synthesizer signal frequency will be 16.270 MHz when the movabled contacts 77a to 77c are connected to the fixed contacts A1, B1 and C1 respectively, and 16.560 MHz when the movable contacts are connected to the fixed contacts A23, B23 and C23 respectively.

Each time the movable contacts 77a to 77c are switched to a different set of fixed contacts in the encoder 25, a corresponding digital output is delivered as aforesaid to the programmable divider 24 to cause the desired change in the output frequency from the VCO 23 or from the PLL frequency synthesizer 20. Let $1/N$ be the frequency dividing ratio of the programmable divider 24. Since $f1/N = fa$, the output frequency from the VCO 23 is determined in accordance with the formula $f1 = N \times fa$.

With the change in the output frequency from the VCO 23, the phase comparator circuit 22 compares the 10 kHz reference frequency from the frequency divider 19 and the VCO frequency that has passed through the programmable divider 24. The output from the phase comparator circuit 22 is utilized to control the VCO 23 in the well known manner so that the output frequency from the programmable divider 24 may approach the 10 kHz reference frequency. The output from the VCO 23 is then locked on the desired new frequency.

In this manner the PLL frequency synthesizer 20 delivers to the first frequency converter 12 the signal $f1$ having a stable frequency selected from among the 23 different frequencies by the actuation of the channel selector switch provided to the encoder 25. The receiver section of the transceiver thus effects the RF signal reception on 23 channels in accordance with the double superheterodyne principle.

In the use of the transceiver as the transmitter, the PLL frequency syntehsizer signal $f1$ with a stable frequency selected from among the 23 different frequencies as above explained is delivered to the third frequency converter 31 of the transmitter section. In this third frequency converter the signal $f1$ is combined with the signal $f3$ from the oscillator 30 having the quartz crystal 37. Since the oscillator signal frequency is assumed to be 10.695 MHz as aforesaid, the mixing of the frequency with the 23 different PLL frequency synthesizer signal frequencies in the band of 16.270 to 16.560 MHz results in the provision of 23 different transmitting frequencies in the band of 26.965 to 27.255 MHz.

The RF carrier signal $fs$ of any selected frequency generated by the third frequency converter 31 is amplified as its passes through the successive amplifier stages 32 to 34. In the driver amplifier-modulator 33 and power amplifier-modulator 34, moreover, the outgoing RF carrier signal undergoes amplitude modulation by the intelligence signal from the microphone 29 via the AF ampifier 16. The amplitude-modulated RF carrier is then fed to the antenna circuit 35 for radiation into space as electromagnetic waves.

In the above described operation of the multichannel transmitter according to the invention, however, the wave radiation at any of the 23 predetermined transmitting frequencies takes place only when the PLL frequency synthesizer 20 is in the normal state of operation. The synthesizer does not produce the signal $f1$ of some desired frequency during the period of transition from the moment when the channel selector switch of the encoder 25 is actuated for selection of the new transmission channel to the moment when the output from the VCO 23 becomes locked on the new frequency. The desired frequency signal $f1$ from the synthesizer will also be not produced in the event of the malfunctioning of, for example, the VCO 23 or prrogrammable divider 24.

Thus, were it not for the transmission stopper circuit 36 according to this invention, the third frequency converter 31 would then generate a carrier of other than the desired transmitting frequency, resulting in abnormal or spurious radiation through the antenna circuit 35. The transmission stopper circuit 36 is designed to prevent such abnormal or spurious radiation of the transmitter.

As previously set forth in connection with FIGS. 3 and 4, the transistor 54 of the transmission stopper circuit 36 becomes conductive when the signal $fb$ supplied to the phase comparator 26 from the programmable divider 24 is not properly locked in frequency or phase to the reference frequency signal $fa$ from the frequency divider 19. Thereupon the transmission stopper circuit delivers the inhibiting signal to the third frequency converter 31, thereby forward-biasing the emitter of the transistor 63 in the converter. With the third frequency converter thus prevented from generating the carrier signal $fs$, the transmitter makes no undesired wave radiation at other than the prescribed transmitting frequencies.

According to another, incidental feature of this invention, the pilot lamp 59 is lit up upon conduction of the transistor 54 of the transmission stopper circuit 36 for visual indication of the fact that the desired synthesizer signal $f1$ is not being produced from the VCO 23. The operator is thus made to know that he should not speak at, or otherwise send intelligence through, the microphone 29 until the pilot lamp goes off.

Figure 6:
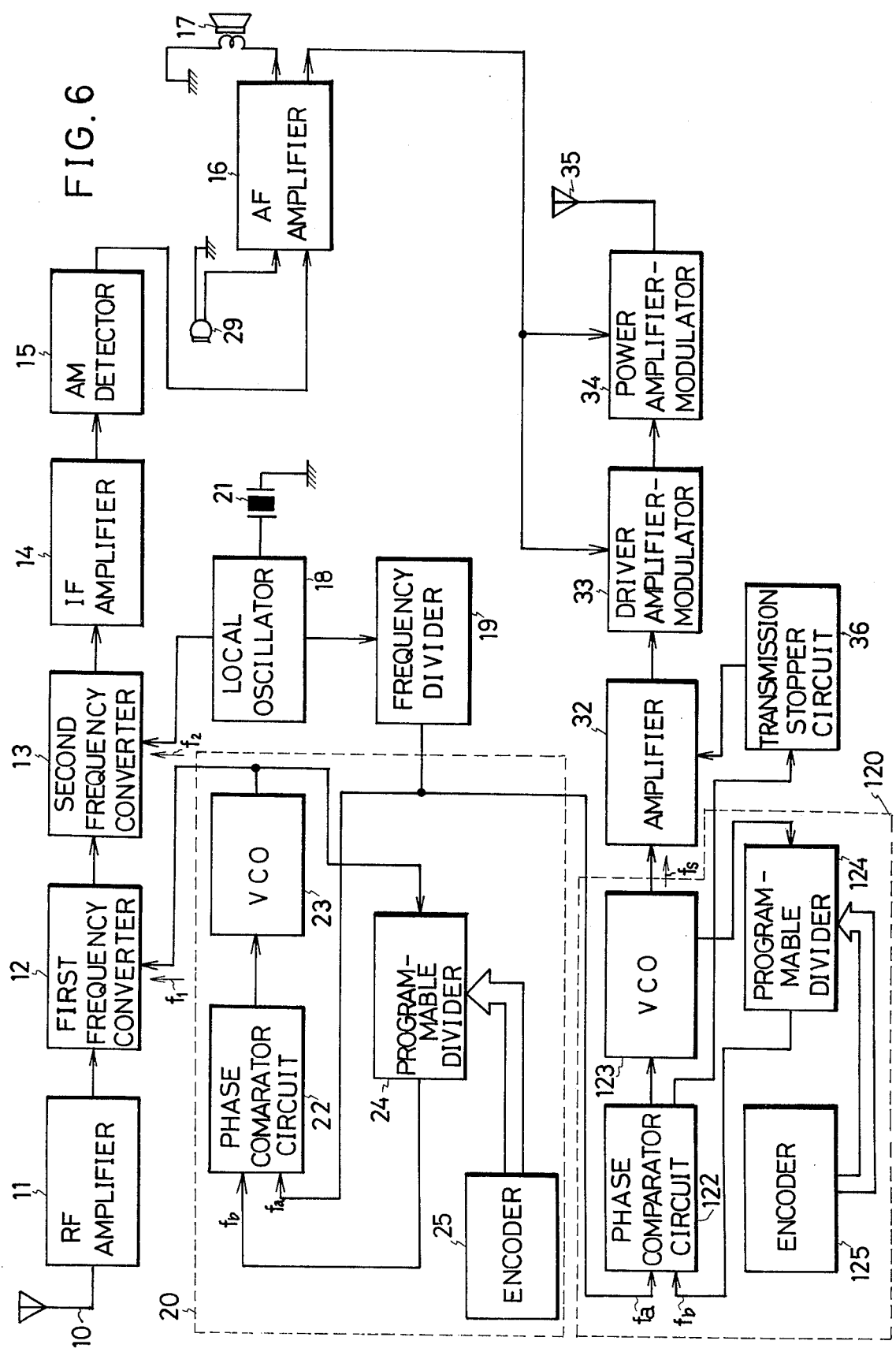
FIG. 6 is a block diagram of another preferred embodiment of the invention.

FIG. 6 illustrates another preferred embodiment of the invention, which differs from the FIG. 1 embodiment in that a second PLL frequency synthesizer 120 is employed in lieu of the crystal oscillator 30 and third frequency converter 31 of the transmitter section and that the transmission stopper circuit 36 is adapted to interrupt the operation of the amplifier 32. The other details are exactly identical with those set forth in conjunction with the preceding embodiment, and the various other parts of the transceiver are identified by the same reference numerals as those used to identify the corresponding parts of the transceiver shown in FIG. 1.

Designed to generate the carrier signal $fs$ of any selected transmitting frequency, the second PLL frequency synthesizer 120 can be of the same configuration as the first PLL frequency synthesizer 20, comprising phase comparator circuit 122 with built-in low-pass filter and amplifier, VCO 123, programmable divider 124, and encoder 125 having the channel selector switch. The phase comparator circuit 122 has the required reference frequency signal supplied from the frequency divider 19, like the phase comparator circuit 22 of the first PLL frequency synthesizer 20.

Figure 7:
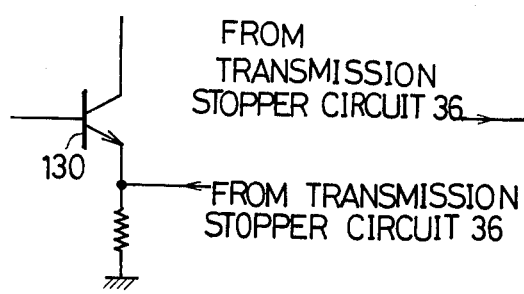
FIG. 7 is a schematic electrical diagram showing part of the amplifier in the embodiment of FIG. 6.

Thus, in event the signal $fb$ supplied to the phase comparator circuit 122 from the programmable divider 124 becomes unlocked from the reference frequency signal $fa$ from the frequency divider 19, the transmission stopper circuit 36 delivers the inhibiting signal to the amplifier 32. As shown in FIG. 7, the amplifier 32 includes a transistor 130, to the emitter of which the inhibiting signal is impressed to terminate conduction through the transistor. The transmitter is thus restrained from making abnormal wave radiation.

Figure 8:
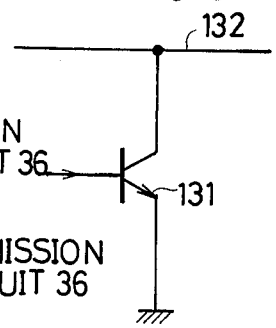
FIG. 8 is a schematic diagram showing alternative means for preventing the abnormal radiation of the transmitter by the transmission stopper circuit.

It will be apparent that the inhibiting signal from the transmission stopper circuit 36 can be applied to any of the components 31 to 34 of the transmitter to prevent its abnormal wave radiation. To this end, as shown in FIG. 8, a transistor 131 may be connected between ground and signal transmission line 132 in any of the transmitter components 31 to 34. The inhibiting signal from the transmission stopper circuit can be applied to the base of the transistor to initiate conduction therethrough and hence to interrupt the signal transmission.

With the invention thus fully described a variety of modifications or changes will readily occur to those skilled in the art. For example, a prescaler may be connected between the VCO 23 or 123 and programmable divider 24 or 124. A light-emitting diode may be used as the pilot lamp 59. The entire PLL frequency synthesizer 20 or 120 may be constituted of a single IC chip. The various frequency values set forth in this specification are purely by way of example. Moreover, while the multichannel transmitter according to this invention has been shown and described as adapted for a transceiver, the invention itself is not to be limited to this particular adaptation.

The above and other modifications or changes within the usual knowledge of the specialists are intended in the foregoing disclosure. It is therefore appropriate that the invention be construed broadly and in a manner consistent with the fair meaning or proper scope of the following claims.

I claim:
1. A multichannel transmitter comprising:
   a. means for producing a reference frequency signal;
   b. a phase-locked loop frequency synthesizer including a phase comparator for comparing the phases between the reference frequency signal and a signal produced by said frequency synthesizer;
   c. a crystal oscillator for producing a constant frequency signal;
   d. a frequency converter connected to said frequency synthesizer and said crystal oscillator for producing a carrier signal of a desired transmitting frequency by combining the output signal from said frequency synthesizer and the constant frequency signal from said crystal oscillator, said frequency converter including a frequency converting transistor;

e. transmission stopper means comprising:
1. sensing means connected to the output of said phase comparator and adapted to be actuated when the output signal from said frequency synthesizer is not locked to the reference frequency signal; and
2. inhibiting means including an inhibiting transistor having a base connected to the output of said sensing means and an emitter-collector circuit connected to said frequency converting transistor, said inhibiting transistor being adapted to become conductive upon actuation of said sensing means for causing nonconduction of said frequency converting transistor and thus for inhibiting the signal production of said frequency converter;

f. means for amplifying the carrier signal produced by said frequency converter;
g. means for modulating the amplified carrier signal with intelligence to be transmitted; and
h. means for radiating the modulated carrier signal into space as electromagnetic waves.

2. The multichannel transmitter as defined in claim 1, including a pilot lamp connected to the collector of said inhibiting transistor so as to be lit up upon conduction of said inhibiting transistor.

* * * * *